United States Patent [19]

Aoki et al.

[11] Patent Number: 4,920,341
[45] Date of Patent: Apr. 24, 1990

[54] MAGNETIC ROTARY ENCODER DEVICE

[75] Inventors: Tsuyoshi Aoki, Wakuya; Yasuhisa Ohsumi, Sendai, both of Japan

[73] Assignee: Alps Electric Co., Ltd., Tokyo, Japan

[21] Appl. No.: 282,806

[22] Filed: Dec. 9, 1988

[30] Foreign Application Priority Data

Mar. 8, 1988 [JP] Japan .............................. 63-29844[U]
Mar. 9, 1988 [JP] Japan .............................. 63-30316[U]

[51] Int. Cl.$^5$ ......................... H03M 1/00; G01B 7/30
[52] U.S. Cl. ......................................... 341/15; 341/9; 324/200
[58] Field of Search ............. 341/13, 15; 250/231 SE; 324/200

[56] References Cited

U.S. PATENT DOCUMENTS

| | | | |
|---|---|---|---|
| 4,274,053 | 6/1981 | Ito et al. ................................... | 341/9 |
| 4,533,830 | 8/1985 | Beauprey . | |
| 4,774,464 | 9/1988 | Kubota et al. ......................... | 341/15 |
| 4,780,703 | 10/1988 | Ishida et al. ........................... | 341/13 |

Primary Examiner—William M. Shoop, Jr.
Assistant Examiner—Helen Kim
Attorney, Agent, or Firm—Guy W. Shoup; Paul J. Winters; David H. Carroll

[57] ABSTRACT

A magnetic rotary encoder which is reduced in overall size and production cost and wherein little torsional force around an axis of a rotary shaft is applied to a bearing for the rotary shaft from a force from an object member for detection and the detection sensitivity does not fluctuate even if the rotary shaft is yielded. The rotary shaft includes a fixed shaft fixedly supported at least at one portion thereof and having an inner race of the bearing secured to an outer periphery thereof, a cylindrical member having an outer race of the bearing secured to an inner periphery thereof, and a magnetic member provided on an outer periphery of the cylindrical member and having magnetic poles formed thereon. A magnetic sensor for detecting a magnetic flux from the magnetic member is supported on the fixed shaft by means of a mounting plate, and a detecting member is mounted in sliding contact with the cylindrical member and rotates, when it is rotated, the magnetic member around the axis of the rotary shaft. A force from the detecting member is received by the single bearing on the fixed shaft.

6 Claims, 5 Drawing Sheets

MAGNETIC ROTARY ENCODER DEVICE

BACKGROUND OF THE INVENTION

1. Field of the Invention

This invention relates to a magnetic rotary encoder for detecting relative movement of an object member for detection to provide a corresponding electric output signal, and more particularly to a magnetic rotary encoder wherein the output characteristic thereof is improved so as to be free from the contact force of an object member for detection.

2. Description of the Prior Art

A rotary encoder which provides an electric output signal indicative of relative movement of an object member for detection is employed in a coordinate input device of the manually operated type called mouse track ball, an image scanner which detects relative movement between an optical record medium and an optical detector to provide output picture image information, and like appliances. Means for detecting such movement as described above include the rotary switch type and the rotary volume type wherein an electric output signal is produced in accordance with a change of the position of electric contact, and the capacitance type, the optical detection type and the magnetic type wherein an electric output signal is produced without contacting with a rotary shaft.

In these days, development of a rotary encoder of the magnetic type which converts an amount of movement into a change of magnetism to provide a corresponding electric output and is advantageous in regard to power consumption and configuration has been made lively. A coordinate input device of the manually operated type (mouse) in which such a magnetic rotary encoder is employed has such a construction as described below.

In particular, a mouse in which a magnetic rotary encoder is employed normally includes a ball which is disposed for rotation in a casing with an end portion thereof projected outwardly of the casing and serves as an object member for detection. The mouse further includes a rotary shaft which is rotated in response to rotation of the ball, a magnetic scale for converting a rotational angle of the rotary shaft into an amount of change of magnetism, and a magnetic sensor for detecting a quantity of magnetism of the magnetic scale. The rotary shaft, magnetic scale and magnetic sensor are also accommodated in the casing. With such a mouse which employs a magnetic rotary encoder of the type mentioned, an end portion of the ball projected outwardly of the casing of the magnetic rotary encoder is contacted with and turned by, for example, a sheet for exclusive use in order to provide an output signal indicative of an amount of movement of a surface of the ball to a graphic display unit.

In such a conventional magnetic rotary encoder as described above, however, since the rotary shaft is disposed for rotation with the opposite ends thereof supported for rotation by a pair of bearings within the casing, the magnetic rotary encoder has a drawback that it has a comparatively great overall size and is produced at a comparatively high cost. In particular, since high durability is required for the bearings on which the opposite ends of the rotary shaft are supported for rotation, the production cost is high and the overall size of the magnetic rotary encoder is great accordingly.

Further, since a component of force of the force which is applied to a substantially central location of the rotary shaft when the ball is rotated is applied to each of the bearings at the opposite ends of the rotary shaft so that a torsional force around an axis of the rotary shaft is imparted to each of the bearings by the rotary shaft which is yielded by a force from the ball, the smoothness of rotation is deteriorated and the life of the bearings is also deteriorated. Further, if the rotary shaft is yielded by a force applied thereto from the ball when the ball is rotated, the distance between a magnetic reluctance sensor secured within the casing and a magnetic scale mounted on a circumferential face of the rotary shaft fluctuates significantly. Consequently, the detection sensitivity of the magnetic rotary encoder fluctuates and a stable detection characteristic is not obtained.

Meanwhile, a coordinate input device in which a conventional magnetic rotary encoder is used as it is has a drawback that it has a comparatively great size and the production cost is comparatively high because first and second rotary shafts are disposed within a casing with the opposite ends thereof supported for rotation by a pair of bearings.

Thus, where a conventional rotational angle detecting means which has, for example, an electric contact, is employed, the first and second rotary shafts are mounted for rotation by way of a pair of bearings on a mounting plate of the casing and transmission gears are provided at end portions of the rotary shafts such that sliding shafts of variable resistors may be rotated by way of the transmission gears. The variable resistors must necessarily be fixedly disposed at locations on the mounting plate of the casing near the end portions of the first and second rotary shafts.

In this instance, the two variable resistors must be disposed with a sufficient spatial room within the casing so that they may not obstruct free rotation of the rotary ball. Accordingly, the first and second rotary shafts have corresponding great axial lengths, and the bearings for supporting the opposite ends of the rotary shafts for rotation are required to be ball bearings which are superior in durability. Consequently, the coordinate input device is high in production cost and has a great overall size accordingly.

SUMMARY OF THE INVENTION

Accordingly, it is an object of the present invention to provide a magnetic rotary encoder which is reduced in overall size and also in production cost.

It is another object of the present invention to provide a magnetic rotary encoder wherein little torsional force around an axis of a rotary shaft is applied to a bearing for the rotary shaft from a force from an object member for detection and the detection sensitivity does not fluctuate even if the rotary shaft is yielded.

In order to attain the objects, according to the present invention, there is provided a magnetic rotary encoder device which comprises a fixed shaft fixedly supported at least at one portion thereof, an inner bearing means provided on an outer periphery of the fixed shaft, an outer bearing means disposed in an opposing relationship to and held in engagement with the inner bearing means with a low coefficient of friction, a cylindrical member having the outer bearing means provided on an inner periphery thereof, a magnetic means provided on an outer periphery of the cylindrical member and extending perpendicularly to the direction of an axis of the outer bearing means, the magnetic means having magnetic poles formed thereon, a magnetic sensor for detecting a magnetic flux from any of the magnetic poles, a mounting plate for fixedly supporting the magnetic sensor on the fixed shaft, and a detecting member mounted in sliding contact with the cylindrical member to rotate the magnetic means around its axis.

With the magnetic rotary encoder device of the present invention, if the magnetic means is rotated together with the cylindrical member by the detecting member, such rotation of the magnetic means is detected with a high degree of accuracy by the magnetic sensor.

The magnetic sensor is small in size and fixedly supported on the fixed shaft by way of the mounting plate which may be secured to an end portion of the fixed shaft and extend in parallel to the fixed shaft. The mounting plate eliminates the necessity of provision of a separate member for mounting of the magnetic sensor and allows reduction in length of the fixed shaft. Besides, since the cylindrical member and the magnetic means are supported for rotation by means of a single bearing such as a ball bearing which is composed of the inner bearing means and the outer bearing means, simplification in structure and miniaturization of the magnetic rotary encoder device can be realized.

Besides, since a force from the detecting member is applied to the bearing during operation of the magnetic rotary encoder device, little torsional force around the axis will be applied to the bearing, which assures smooth rotation of the cylindrical member and the magnetic means and elongation of the operation life of the bearing.

Further, even if the fixed shaft is yielded by a force from the detecting member, the distance between the magnetic means and the magnetic sensor presents a little variation. Consequently, a stabilized output can be obtained from the magnetic rotary encoder device.

Where the present invention is applied to a coordinate input device, the coordinate input device comprises a rotary ball mounted for rotation in perpendicular X and Y directions around its center, a first rotary shaft held in contact with the rotary ball for rotation by the latter, a second rotary shaft extending in a direction perpendicular to the first rotary shaft and held in contact with the rotary ball for rotation by the rotary ball, and a pair of magnetic reluctance sensors provided one for each of the first and second rotary shafts for detecting rotational angles of the first and second rotary shafts to provide input signals corresponding to rotational angles of the rotary ball in the perpendicular X and Y directions, each of the first and second rotary shafts including a fixed shaft secured at least at one end thereof to a casing of the coordinate input device, a ball bearing having an inner race secured to the fixed shaft, a cylindrical member secured at an inner wall thereof to an outer race of the ball bearing, and a plastic magnet mounted on an outer peripheral wall of the cylindrical member and having alternate north and south magnetic poles formed in a circumferential row thereon, the plastic magnet being disposed in an opposing spaced relationship by a predetermined distance to a corresponding one of the magnetic reluctance sensors, the rotary ball being held in contact with an outer periphery of each of the cylindrical members on an extension line of a radial line of a corresponding one of the ball bearings.

With the coordinate input device, the plastic magnet may be made of a moldable magnetic plastic material and may be mounted, for example, by means of outsert molding on the outer peripheral wall of the cylindrical member of each of the first and second rotary shafts which may be made of a metal.

Thus, if the rotary ball is rotated, then the first and second rotary shafts are rotated by corresponding amounts in the X and Y directions by the rotary ball. The rotational amounts of the first and second rotary shafts are detected by the plastic magnets disposed in the predetermined opposing spaced relationship to the plastic magnets with a high degree of accuracy.

Further, since the plastic magnets are provided directly on the first and second rotary shafts without any other member interposed therebetween, the first and second rotary shafts can be reduced significantly in axis length thereof, and since each of the first and second rotary shafts is supported for rotation only by means of a single bearing in the form of a ball bearing, the first and second rotary shafts are simplified in structure, which allows reduction in overall size of the coordinate input device.

Further, since the ball bearing is disposed on an extension line interconnecting the center of the rotary ball and a contact point between the rotary ball and the outer periphery of the cylindrical member, a force from the rotary ball is applied to the ball bearing. Accordingly, little torsional force is applied to the bearing around the axis of rotation, which assures smooth rotation of the rotary shafts and stabilized operation of the coordinate input device.

The above and other objects, features and advantages of the present invention will become apparent from the following description and the appended claims, taken in conjunction with the accompanying drawings.

DETAILED DESCRIPTION OF THE PREFERRED EMBODIMENT

A magnetic rotary encoder device according to a preferred embodiment of the present invention described below includes a rotary ball employed as a detecting member and a pair of rotary shafts corresponding to an X-axis direction and a Y-axis direction. The magnetic rotary encoder is applied to a coordinate input device for inputting an X coordinate data and a Y coordinate data.

Figure 1:
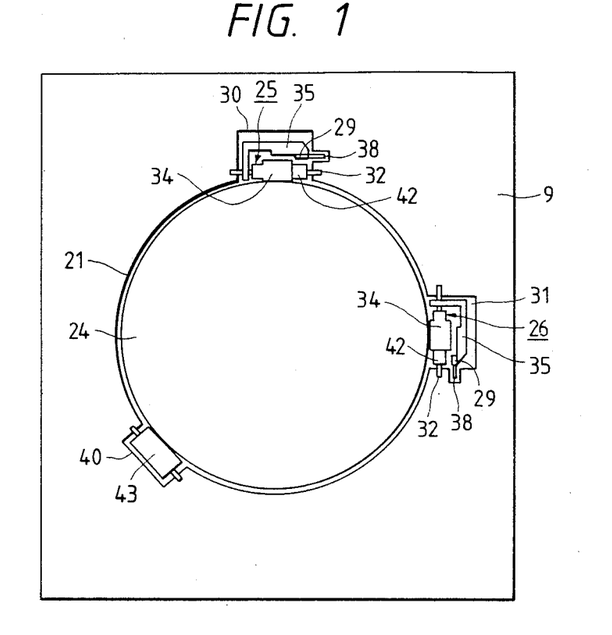
FIG. 1 is a bottom plan view of a coordinate input device in which a magnetic rotary encoder device according to the present invention is incorporated.
Figure 5:
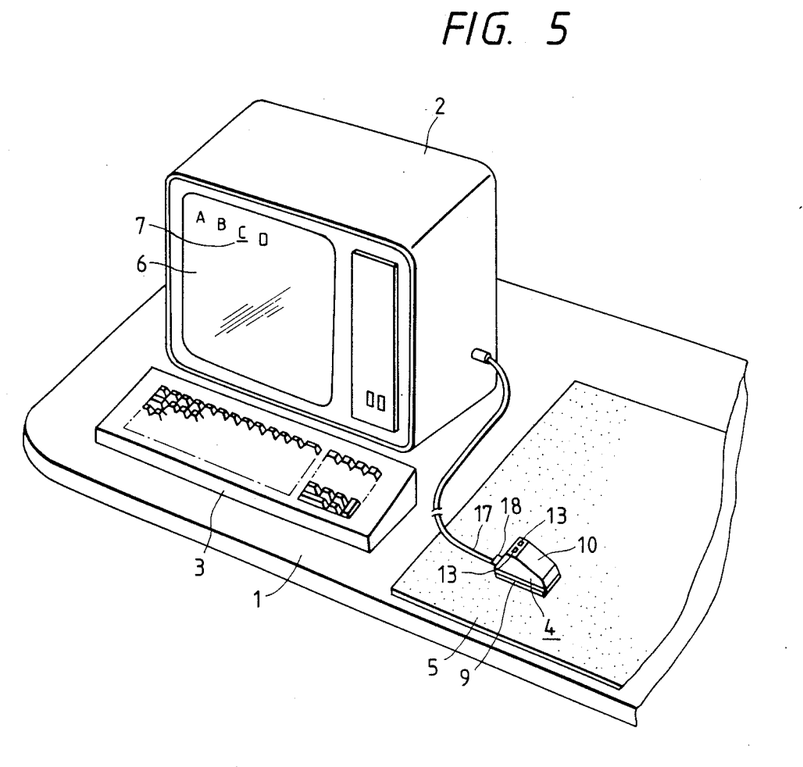
FIG. 5 is a perspective view showing a system including a graphic display unit and the coordinate input device shown in FIG. 1.

Referring first to FIG. 5, a coordinate input device to which a magnetic rotary encoder device of the present invention is applied is generally denoted at 4. The coordinate input device 4 includes a case member which is composed of a base plate 9 on a sheet 5 side which is designed to cover an outer periphery of the coordinate input device 4 and presents a predetermined frictional resistance with respect to a surface of a rotary ball 24 disposed on a computer operating table which will be hereinafter described, and an upper case 10 which exposes the remaining part of the coordinate input device 4 not covered by the base plate 9 and thus exposes operating knob portions of a plurality of computer operating switches 13 which will be hereinafter described so that they may be manually operated from an outside of the coordinate input device 4. Referring to FIG. 1, the base plate 9 on the sheet 5 side has a circular opening 21 formed therein, and the rotary ball 24 is mounted for rotation by means of three rotary members which will be hereinafter described in the inside of the base plate 9 and the upper case 10 such that with an end portion thereof may be projected outwardly of the case member through the circular opening 21. A pair of mounting recesses 30 and 31 are formed in the base plate 9 along an inner circumference of the circular opening 21 in an angularly spaced relationship by an angle of about 90 degrees around the position of the center of the circular opening 21. Each of the mounting recesses 30 and 31 has four walls contiguous to a circumferential face of an open end of the circular opening 21 and is opened also in a direction to the inside of the case member.

First and second rotary shafts 25 and 26 are mounted for rotation in the mounting recesses 30 and 31 of the base plate 9, respectively. Here, description will be given on the first rotary shaft 25. In particular, referring to FIGS. 2 and 3, the first rotary shaft 25 is an assembly including, as principal components, a fixed shaft 32, a ball bearing 33, a cylindrical member 34 and a plastic magnet 42 formed on an outer wall of the cylindrical member 34.

Figure 2:
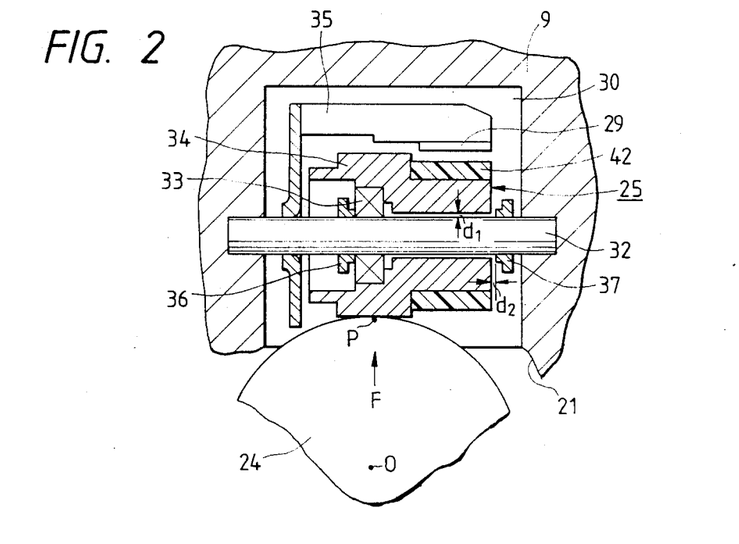
FIG. 2 is an enlarged sectional view of part of a detecting mechanism of the coordinate input device shown in FIG. 1.
Figure 3:
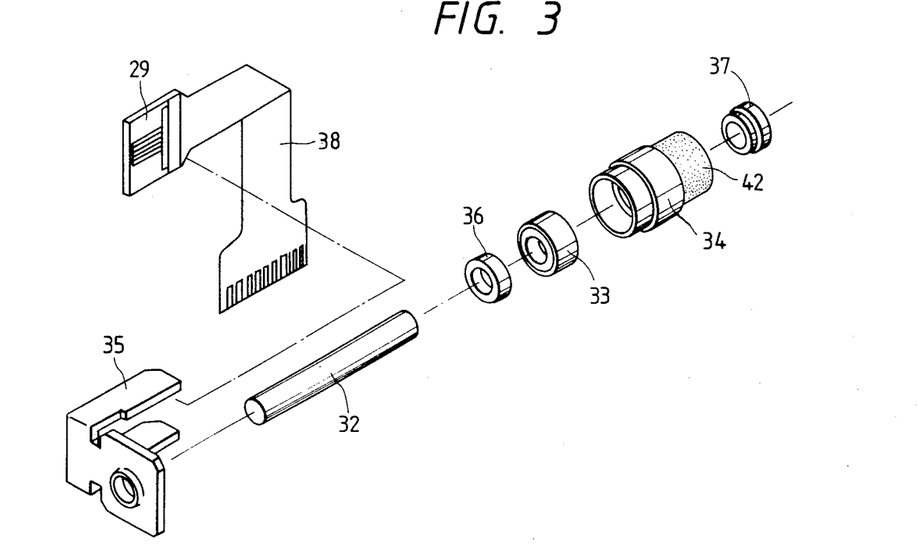
FIG. 3 is a fragmentary perspective view showing components of the detecting mechanism of FIG. 2.
Figure 4:
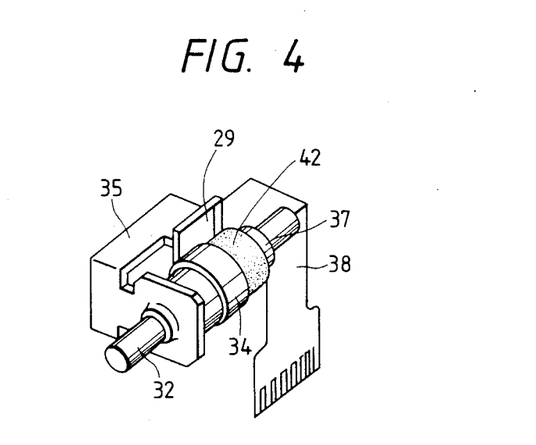
FIG. 4 is a perspective view showing the detecting mechanism of FIG. 3 in an assembled condition.

The opposite ends of the fixed shaft 32 are secured in a pair of opposing inner walls of the mounting recess 30 formed in the base plate 9 of the case member. A mounting plate 35 is secured at an end portion of the fixed shaft 32 by force fitting, and a first sleeve 36 is fitted on the fixed shaft 32 by press fitting such that it may hold against the ball bearing 33 described below.

An inner race of the ball bearing 33 is secured to the fixed shaft 32 while an outer race of the ball bearing 33 is secured to an inner peripheral wall of the cylindrical member 34. The plastic magnet 42 is mounted on the outer wall of the cylindrical member 34 by means of insert molding and has alternate north and south magnetic poles formed in a circumferential row thereon. A second positioning sleeve 37 for limiting the amount of movement of the cylindrical member 34 in the longitudinal direction of the fixed shaft 32 is fitted on the fixed shaft 32 by press fitting and disposed in a spacing defined by the cylindrical member 34 and an opposing first inner wall face of the right-hand side mounting recess 30 of the base plate 9 which has a pair of holding grooves formed at left and right portions thereof for holding the fixed shaft 32 thereon as shown in FIG. 2.

The holding condition of the fixed shaft 32 by the holding grooves is such that the fixed shaft 32 is positioned with respect to the direction indicated by a reference symbol F and an arrow mark in FIG. 2 from the central position of the circular opening 21 and also to the opposite direction by the holding grooves which are formed in the first inner wall shown on the right-hand side in FIG. 2 and an opposing second inner wall and extend in a direction in which the rotary ball 24 receives gravity upon operation thereof and which is a direction perpendicular to the longitudinal direction of the fixed shaft 32, and the fixed shaft 32 is positioned with respect to the direction in which the rotary ball 24 receives gravity upon operation thereof by small walls at terminal end portions not shown of the grooves provided on the lower face side of the base plate 9 while, with respect to the direction opposite the direction in which the rotary ball 24 receives gravity, the fixed shaft is prevented from jumping out by means of two pairs of snap projections not shown which are projected toward each other so as to partially reduce the width of the grooves with the fixed shaft 32 held therebetween. Positioning of the fixed shaft 32 in its rotational direction is attained such that a third inner wall provided on the mounting recess 30 on the lower face side of the base plate 9 adjacent the circular opening 21 and the first and second inner walls is contacted with a side of an angular face portion having a press fit fixing portion thereon for the mounting plate 35 which is formed from a metal plate material by press work and secured by force fitting to the left-hand side shown in FIG. 2 of the fixed shaft 32 opposing to the third inner wall so as to prevent rotation of the fixed shaft 32. A portion of the mounting plate 35 on which a magnetic sensor which will be hereinafter described is securely mounted is spaced by a sufficient distance from the first and second inner walls and a fourth inner wall face adjacent the third inner wall of the mounting recess 30 so that it may not be contacted with the latter.

It is to be noted that, when the coordinate input device 4 is used, the fixed shaft 32 is a little yielded by a force applied thereto from the rotary ball 24. In order to prevent rotation of the first and second rotary shafts 25 and 26 from being obstructed even in such a case, a clearance $d_1$ of 0.2 mm or so is provided between the fixed shaft 32 and an inner wall of the cylindrical member 34 while a distance $d_2$ of 0.3 mm or so at a maximum value is provided between opposing end faces of the second sleeve 37 and the cylindrical member 34.

The mounting plate 35 extends in an integral relationship along an outer wall of the cylindrical member 34 of the first rotary shaft 25 mounted for rotation in the mounting recess 30 of the base member 9 in this manner, and an end portion of the extension of the mounting plate 35 is opposed to the plastic magnet 42 formed on the outer periphery of the cylindrical member 34 with a predetermined distance (0.2 mm, for example) left therebetween. A magnetic reluctance sensor 29 is secured by adhesion to the face of the mounting plate 35 opposing to the plastic magnet 42, and a flexible connector 38 is connected to output terminals of the magnetic reluctance sensor 29.

Figures 6A, 6B, 6C:
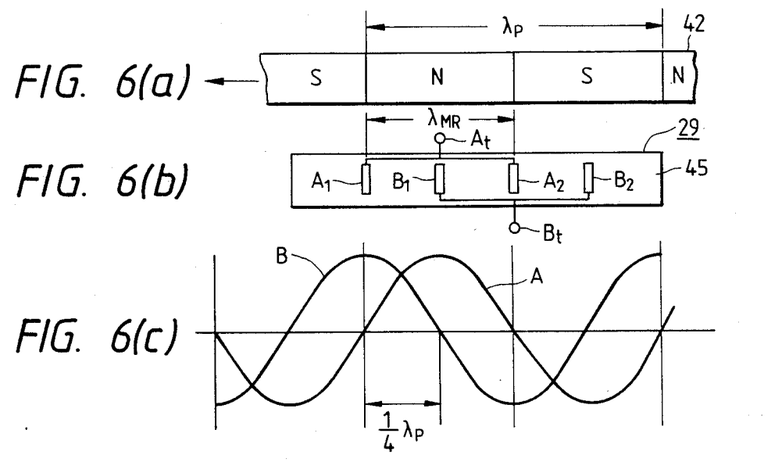
FIGS. 6(a), 6(b) and 6(c) are diagrammatic representations illustrating a detecting operation of the detecting mechanism of FIG. 2.

Referring to FIG. 6(b), the magnetic reluctance sensor 29 includes a pair of magneto-resistance elements $A_1$ and $A_2$ disposed in a spaced relationship by a pitch $\lambda_{MR}$ on a substrate 45, another magneto-resistance element $B_1$ located at the center between the magneto-resistance elements $A_1$ and $A_2$ on the substrate 45, and a further magneto-resistance element $B_2$ disposed on the substrate 45 in a spaced relationship by a distance equal to the pitch $\lambda_{MR}$ from the magneto-resistance element $B_1$.

Figure 7:
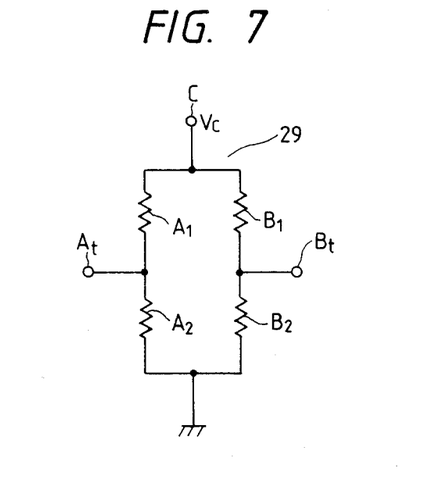
FIG. 7 is a circuit diagram showing an electric circuit construction of a magnetic sensor which employs a magneto-resistance effect element.

Referring now to FIG. 7, the magneto-resistance elements $A_1$ and $A_2$ are connected in series between an application terminal C of a bias voltage Vc and the ground, and a series circuit of the magneto-resistance elements $B_1$ and $B_2$ is connected in parallel to the series circuit of the magneto-resistance elements $A_1$ and $A_2$. An output terminal At is connected to a junction between the magneto-resistance elements $A_1$ and $A_2$, and another output terminal Bt is connected to a junction between the magneto-resistance elements $B_1$ and $B_2$.

Meanwhile, the plastic magnet 42 has the magnetic north and south poles formed thereon in an alternate relationship by a pitch $\lambda_P$ in the circumferential direction thereof as shown in FIG. 6(a).

The other rotary shaft 26 shown in FIG. 2 is mounted similarly in the mounting recess 31 of the base plate 9 and has the same construction as the first rotary shaft 25 described above. Description of the rotary shaft 26, accordingly, will be omitted herein to avoid redundancy.

Further, in order that transmission of power between the rotary ball 24 and the first and second rotary shafts 25 and 26 may be made with certainty, a further mounting recess 40 is formed at a location of the base plate 9 on a bisector between axial lines of the first and second rotary shafts 25 and 26 and a resilient urging roller 43 is disposed for rotation in the mounting recess 40 as shown in FIG. 1. The resilient urging roller 43 normally urges the rotary ball 24 resiliently against the first and second rotary shafts 25 and 26 and is rotated by the rotary ball 24 as the rotary ball 24 rotates.

Further, a mounting base not shown is provided downwardly in an opposing relationship to the rotary ball 24 on an inner face of the upper case 10 which is disposed to cover the base plate 9 as described hereinabove, and a cleaning member made of felt for cleaning the rotary member 24 is mounted by adhesion on the mounting base such that it is normally held in light contact with a surface of the rotary ball 24.

Referring back to FIG. 5, the upper case 10 of the coordinate input device 4 has a pair of fitting holes formed therein, and an end portion of the switch 13 for manual operation is fitted in each of the fitting holes of the upper case 10. A printed circuit board not shown having predetermined conductor patterns formed thereon is secured within the case member, for example, by means of a fastening screw, and the operating end portions of the switches 13 are connected to predetermined locations of the printed circuit board. Further, a bush 18 made of rubber for leading out a signal line 17 is held between the base plate 9 and the upper case 10 of the case member, and an end of the signal line 17 is connected to a predetermined location of the printed circuit board. While the ends of the switches 13 and the signal line 17 are connected to the printed circuit board in this manner, the output terminals of the magnetic reluctance sensor 29 described hereinabove are also connected to the printed circuit board each by way of the flexible connector 38.

Operation of the magnetic rotary encoder device of the embodiment of the present invention will be described in the following.

FIG. 5 shows a system wherein the coordinate input device in which the magnetic rotary encoder is incorporated is connected to a graphic display unit 2. The graphic display unit 2 and an input device 3 including function keys are disposed on the table 1, and the coordinate input device 4 is disposed on the sheet 5 placed on the table 1. The coordinate input device 4 and the graphic display unit 2 are interconnected by the signal line 17.

In this condition, if the coordinate input device 4 is moved on the sheet 5, then the rotary ball 24 is rotated so that the plastic magnet 42 provided in an opposing relationship to the rotary ball 24 is rotated together with the rotary shaft 25 around the axis of the rotary shaft 25 by the rotary ball 24 in accordance with movement of the coordinate input device 4 in the Y-axis direction.

As the plastic magnet 42 is rotated in this manner, a magnetic field produced by the plastic magnet 42 is varied at positions of the individual magneto-resistance elements $A_1$, $A_2$, $B_1$ and $B_2$ of the magnetic reluctance sensor 29 disposed in an opposing adjacent relationship to the plastic magnet 42 so that the resistances of the magneto-resistance elements $A_1$, $A_2$, $B_1$ and $B_2$ are varied. Since the magneto-resistance elements $A_1$, $A_2$, $B_1$ and $B_2$ of the magnetic reluctance sensor 29 are connected in such a bridge circuit as seen in FIG. 7, output signals A and B obtained from the output terminals At and Bt of the circuit in response to variations of the resistances of the magneto-resistance elements $A_1$, $A_2$, $B_1$ and $B_2$ exhibit such variations as shown in FIG. 6(c).

The output signals A and B vary substantially in sinusoidal waveforms with respect to a rotational angle of the plastic magnet 42 on the first rotary shaft 25. Since the difference in phase angle between the output signals A and B is equal to $\frac{1}{4} \lambda_P$, a Y-axis input signal is calculated in accordance with the output signals A and B by means of a predetermined operating circuit on the printed circuit board and is transmitted to the graphic display unit 2.

Also from the movement of the rotary ball 24 in the X-axis direction which is detected upon rotation of the plastic magnet 42 on the second rotary shaft 26, an output signal of the magnetic reluctance sensor 29 for the second rotary shaft 26 is calculated, and also the X-axis input signal is transmitted to the graphic display unit 2.

In this manner, an X-axis input signal and a Y-axis input signal corresponding to rotation of the rotary ball 24 are transmitted to the graphic display unit 2 upon movement of the coordinate input device 4 on the sheet 5, and, for example, a cursor 7 indicated on a screen 6 of the graphic display unit 2 is moved to a predetermined position.

It is to be noted that dust which may stick to the rotary ball 24 during rotation of the rotary ball 24 is removed by the cleaning member mentioned hereinabove. Accordingly, the rotary ball 24 located in an opposing relationship to the first and second rotary shafts 25 and 26 are normally held clean so that inputting operation will be carried out with a high degree of accuracy.

Figure 8:
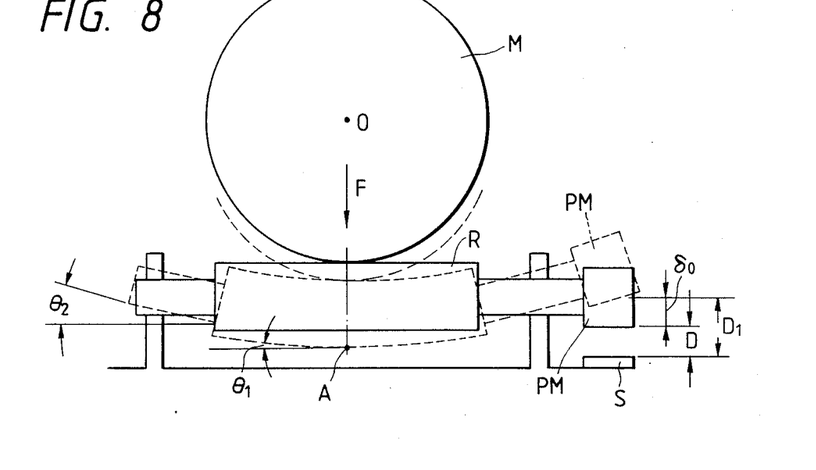
FIG. 8 is a schematic view of a shaft of a detecting mechanism in a yielded condition illustrating a drawback of a conventional detecting mechanism.

FIG. 8 shows a condition of a driven rotary member R supported for rotation at the opposite ends thereof when a force F is applied to the driven rotary member R by a driving rotary member M. While the driven rotary member R is yielded as shown by broken lines in FIG. 8 by the force F applied thereto, the angle $\theta_2$ of the driven rotary member R at a supported position of the driven rotary member R after it is yielded with respect to the direction of the axis of the driven rotary member R before it is yielded is apparently greater than the similar angle $\theta_1$ at a substantially central location A of the driving rotary member R at which the force F is applied. Therefore, if a pair of bearings are provided at the opposite ends of the driven rotary member R as in a conventional arrangement, then a torsional force around the axis of the rotary member R depending upon the angle $\theta_2$ is applied to the bearings, which makes rotation of the rotary member R less smooth. To the contrary, where a bearing is located substantially at the center of the rotary member R as in the embodiment described above, little torsional force will be applied to the bearing. Consequently, smooth rotation of the rotary member R is assured and the operation life of the bearing is extended.

Figure 9:
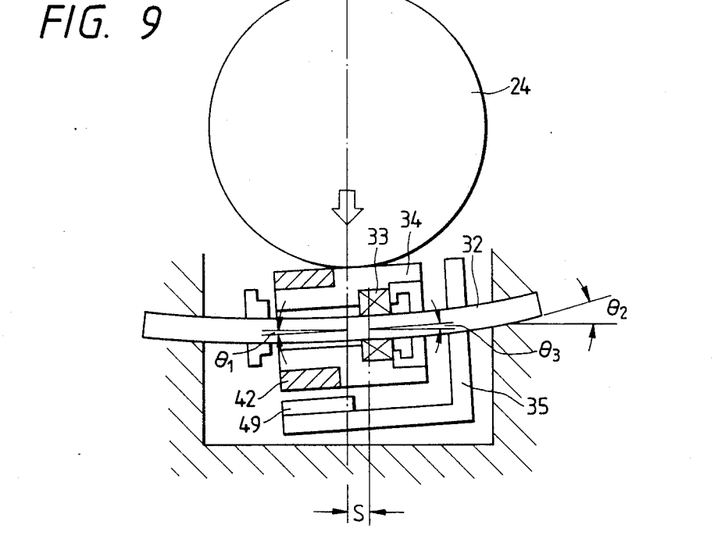
FIG. 9 is a schematic sectional view illustrating a yielded condition of a shaft in the detecting mechanism shown in FIG. 2.
Figure 10:
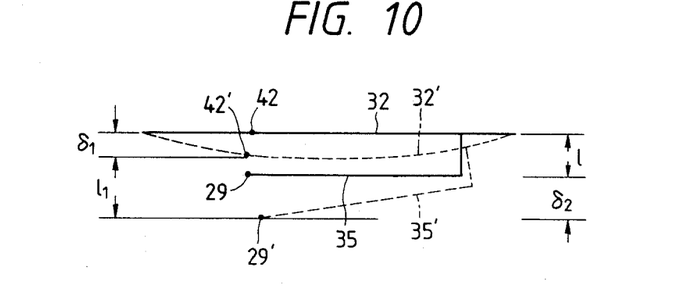
FIG. 10 is a diagrammatic representation illustrating the yielded condition of the shaft of FIG. 9.

FIGS. 9 and 10 illustrate the fixed shaft 32 in a yielded condition under the force from the rotary ball 24 in the magnetic rotary encoder device described hereinabove. If the fixed shaft 32 is yielded as shown by a broken line 32' in FIG. 10, the plastic magnet 42 is moved to a location denoted at 42' while the magnetic reluctance sensor 29 is moved to a location denoted at 29'.

Thus, where the distance between the plastic magnet 42 and the magnetic reluctance sensor 29 before the fixed shaft 42 is yielded is represented by l, the displacement of the plastic magnet 42 by yielding of the fixed shaft 32 by $\delta_1$ and the displacement of the magnetic reluctance sensor 29 by $\delta_2$, the distance $l_1$ between the plastic magnet 42 and the magnetic reluctance sensor 29 when the fixed shaft 32 is yielded is provided by the following equation:

$$l_1 = l + \delta_2 - \delta_1 \tag{1}$$

To the contrary, in the case of the conventional arrangement wherein the plastic magnet PM is mounted at an end portion of the rotary shaft R and a magnetic reluctance sensor S is provided at a stationary portion of a case member, where the distance between the plastic magnet PM and the magnetic reluctance sensor S is represented by D and the displacement of the plastic magnet PM by yielding of the rotary shaft R by $\delta_0$, the distance $D_1$ between the plastic magnet PM and the magnetic reluctance sensor S when the rotary shaft R is yielded is provided by the following equation:

$$D_1 = D + \delta_0 \tag{2}$$

From the actual structure, apparently $\delta_0 > \delta_2 - \delta_1$. Thus, even if the fixed shaft 32 is yielded, the plastic magnet 42 and the magnetic reluctance sensor 29 will be moved substantially by the same amount in the same direction. Accordingly, the detection sensitivity of the magnetic reluctance sensor 29 is not varied and a stabilized output can be obtained from the magnetic reluctance sensor 29.

Meanwhile, in case the position of the ball bearing 33 is displaced by an amount of S from a straight line interconnecting a contact point between the rotary ball 24 and the cylindrical member 34 and the center of the rotary ball 24 as shown in FIG. 9, the angle of the fixed shaft 32 with respect to the axis of the fixed shaft 43 at the position of the ball bearing 33 is now $\theta_3$. The angle $\theta_3$ is greater than the angle $\theta_1$ of the fixed shaft 32 on an extension line interconnecting the center of the rotary ball 24 and the aforementioned contact point but is smaller than the angle $\theta_2$ at the end portion of the fixed shaft 32.

Accordingly, even if the contact point of the rotary ball 24 is displaced a little from the position of the ball bearing 33 in this manner, the torsional force applied to the ball bearing 33 around the axis of the fixed shaft 32 is very small, and accordingly smooth rotation of the rotary shaft is assured.

Further, since the first and second rotary shafts 25 and 26 are each constructed such that the inner wall of the cylindrical member 34 is secured to the outer race of the bearing 33 of which the inner race is secured to the fixed shaft 32 having the opposite ends secured to the base plate 9 of the case member, the bearing 33 is assembled one for each rotary shaft, resulting in significant reduction in production cost of the magnetic rotary encoder device. In this manner, the quantity of parts is reduced and the axial lengths of the shafts are also reduced, resulting in significant reduction in overall size of the magnetic rotary encoder device.

It is to be noted that, while the coordinate input device described above has such a structure that the rotary ball is partially projected outwardly from the base plate of the case member, and as the rotary ball is rolled on the sheet, the coordinate input device provides an input signal, for example, to the graphic display unit, it may alternatively have such a structure commonly called track ball that the rotary ball is partially projected outwardly from the upper case of the case member so that the projected portion of the rotary ball may be operated by fingers to rotate the rotary ball to provide an input signal.

Further, it is possible to apply the present invention to a device for measuring an amount of one dimensional movement. In particular, similar improvements can be made to a device wherein the force which causes yielding of a shaft presents a variation, such as, for example, a device for detecting a feeding amount of an image scanner which detects picture image data from paper or the like.

In a more effective modification, the ball bearing 33 is disposed on an extension line interconnecting the center O of the rotary ball 24 and a contact point P between the rotary ball 24 and the outer wall of the cylindrical member 34. Due to the arrangement, the force F from the ball bearing 33 is applied to the ball bearing 33, and accordingly, little torsion around the axis is applied to the ball bearing 33.

Thus, since the ball bearing 33 is disposed on the extension line interconnecting the center O of the rotary ball 24 and the contact point P between the rotary ball 24 and the cylindrical member 34, the force F from the rotary ball 24 is applied to the ball bearing 33. Accordingly, the yielding of the first and second rotary shafts 25 and 26 by the force F from the rotary ball 24 is small in amount, and the inclination angle of the fixed shaft 32 at the ball bearing 33 disposed substantially at the center of the rotary shaft 25 or 26 by yielding is smaller than the inclination angle of the fixed shaft 32 at the opposite ends of the fixed shaft 32 by yielding. Accordingly, a torsional force to the ball bearing 33 around the axis is seldom produced so that smooth rotational movement is continued and the life of the ball bearing 33 is extended.

Further, since the magnetic rotary encoder device according to the embodiment of the present invention has such a structure that a coordinate position is detected with a high degree of accuracy by the magnetic reluctance sensor and the plastic magnet 42 is disposed on the outer peripheral wall of the cylindrical member 34 of each of the first and second rotary shafts 25 and 26, the axial lengths of the first and second rotary shafts 25 and 26 can be reduced significantly.

As apparent from the foregoing description, according to the present invention, since a force from the detecting member is received by a single bearing composed of the inner and outer bearing means and the magnetic sensor is supported at a predetermined position relative to the magnetic means by means of the fixed shaft on which the bearing is mounted, various effects can be anticipated that no operational error will be caused by a variation of the force applied from the detecting member to the fixed shaft, and reduction in overall size and production cost of the magnetic rotary encoder device is enabled. The torsional force to the bearing is also reduced, and the variation in detection sensitivity caused by displacement of a location at which an external force is applied to the cylindrical member is also reduced. Thus, the magnetic rotary encoder device can provide a stabilized output and assure measurement with a high degree of accuracy.

Further, since the location of the center of the bearing force at the bearing is set to a position near the location at which a force is received from the detecting member, additional effects can be anticipated that smooth rotation can be maintained without the necessity of increasing an operational force against a torsional force applied to the bearing and the operation life of the magnetic rotary encoder device is extended. Accordingly, an appliance in which the magnetic rotary encoder device is employed will have a high reliability.

Having now fully described the invention, it will be apparent to one of ordinary skill in the art that many changes and modifications can be made thereto without departing from the spirit and scope of the invention as set forth herein.

What is claimed is:

1. A magnetic rotary encoder device, comprising a fixed shaft fixedly supported at least at one portion thereof, an inner bearing means provided on an outer periphery of said fixed shaft, an outer bearing means disposed in an opposing relationship to and held in engagement with said inner bearing means with a low coefficient of friction, a cylindrical member having said outer bearing means provided on an inner periphery thereof, a magnetic means provided on an outer periphery of said cylindrical member and extending perpendicularly to the direction of an axis of said outer bearing means, said magnetic means having magnetic poles formed thereon, a magnetic sensor for detecting a magnetic flux from any of said magnetic poles, a mounting plate for fixedly supporting said magnetic sensor on said fixed shaft, and a detecting member mounted in sliding contact with said cylindrical member to rotate said magnetic means around its axis.

2. A magnetic rotary encoder device according to claim 1, wherein said detecting member, said cylindrical member and said inner and outer bearing means are arranged such that the force of said detecting member pressing against said cylindrical member acts upon the position of the center of the bearing force between said inner and outer bearing means.

3. A magnetic rotary encoder device according to claim 2, wherein said detecting member is a spherical member, and said fixed shaft, inner bearing means, outer bearing means, cylindrical member, magnetic means, magnetic sensor and mounting plate are disposed in two sets, the respective cylindrical members thereof being in slidable contact at points with said spherical member and having respective axes extending in perpendicular directions with respect to the center of said spherical member; further comprising a rotary member mounted for rotation and in sliding contact with said spherical member at a position on a bisector between extension lines of the axes of said cylindrical members remote from the contact points between said spherical member and said cylindrical members, the force of said spherical member being received at said cylindrical members and said rotary member.

4. A magnetic rotary encoder device according to claim 1, wherein said fixed shaft is fixedly supported on a case member which covers said detecting member such that a turning torque may be transmitted to said detecting member, and said case member and said mounting plate are held in contact with each other.

5. A magnetic rotary encoder device according to claim 3, wherein said detecting member is a spherical member, and said fixed shaft, inner bearing means, outer bearing means, cylindrical member, magnetic means, magnetic sensor and mounting plate are disposed in two sets, the respective cylindrical members thereof being in slidable contact at points with said spherical member and having respective axes extending in perpendicular directions with respect to the center of said spherical member; further comprising a rotary member mounted for rotation and in sliding contact with said spherical member at a position on a bisector between extension lines of the axes of said cylindrical members remote from the contact points between said spherical member and said cylindrical member, the force of said spherical member being received at said cylindrical members and said rotary member.

6. A magnetic rotary encoder device according to claim 1, wherein said detecting member is a spherical member, and said fixed shaft, inner bearing means, outer bearing means, cylindrical member, magnetic means, magnetic sensor and mounting plate are disposed in two sets, the respective cylindrical members thereof being in slidable contact at points with said spherical member and having respective axes extending in perpendicular directions with respect to the center of said spherical member; further comprising a rotary member mounted for rotation and in sliding contact with said spherical member at a position on a bisector between extension lines of the axes of said cylindrical members remote from the contact points between said spherical member and said cylindrical members, the force of said spherical member being received at said cylindrical members and said rotary member.

* * * * *